(12) United States Patent
Kao et al.

(10) Patent No.: US 9,853,630 B2
(45) Date of Patent: Dec. 26, 2017

(54) SKEW-TOLERANT FLIP-FLOP

(71) Applicant: Taiwan Semiconductor Manufacturing Company Limited, Hsinchu (TW)

(72) Inventors: Jerry Chang-Jui Kao, Taipei (TW); Chi-Lin Liu, New Taipei (TW); Lee-Chung Lu, Taipei (TW); Shang-Chih Hsieh, Taoyuan County (TW); Bor-Tyng Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 11 days.

(21) Appl. No.: 14/940,563

(22) Filed: Nov. 13, 2015

(65) Prior Publication Data
US 2017/0141766 A1    May 18, 2017

(51) Int. Cl.
*H03K 3/3562* (2006.01)
*H03K 5/133* (2014.01)
*H03K 5/00* (2006.01)

(52) U.S. Cl.
CPC ......... *H03K 3/35625* (2013.01); *H03K 5/133* (2013.01); *H03K 2005/00019* (2013.01)

(58) Field of Classification Search
CPC .................................................. H03K 3/3562
See application file for complete search history.

(56) References Cited

U.S. PATENT DOCUMENTS

| | | | |
|---|---|---|---|
| 6,289,477 B1 * | 9/2001 | Gunadisastra ... | G01R 31/31854 324/750.3 |
| 7,345,518 B2 * | 3/2008 | Branch .......... | G01R 31/318552 327/203 |
| 7,358,786 B2 * | 4/2008 | Kim ............... | G01R 31/318552 327/202 |

* cited by examiner

*Primary Examiner* — Hai L Nguyen
(74) *Attorney, Agent, or Firm* — Jones Day

(57) ABSTRACT

A flip-flop includes a master latch configured to receive a data signal and a scan input signal. The master latch provides one of the data signal or the scan input signal to a slave latch based on a scan enable signal. The flip-flop includes circuitry configured to generate clock signals based on one or both of an input clock signal and the scan enable signal. A first clock signal is provided to the master latch and a second clock signal is provided to the slave latch. The first clock signal does not include edge transitions that occur at same times as edge transitions of the second clock signal when the scan enable signal has a first logic level. The first clock signal includes edge transitions that occur at same times as edge transitions of the second clock signal when the scan enable signal has a second logic level.

20 Claims, 10 Drawing Sheets

SKEW-TOLERANT FLIP-FLOP

BACKGROUND

Most digital circuits use one or more clock signals that determine the rate at which functional units of the circuit operate to guarantee proper communication among the functional units. Circuits that use such clock signals are commonly referred to as synchronous circuits. The time difference between the arrival of a clock signal at different points of a synchronous circuit is known as clock skew. For a correct functioning of a synchronous circuit, clock skew must be maintained at an acceptable level. Alternatively, circuit components that can operate despite clock skew (i.e., skew-tolerant circuit components) may be used to address the issue of clock skew.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
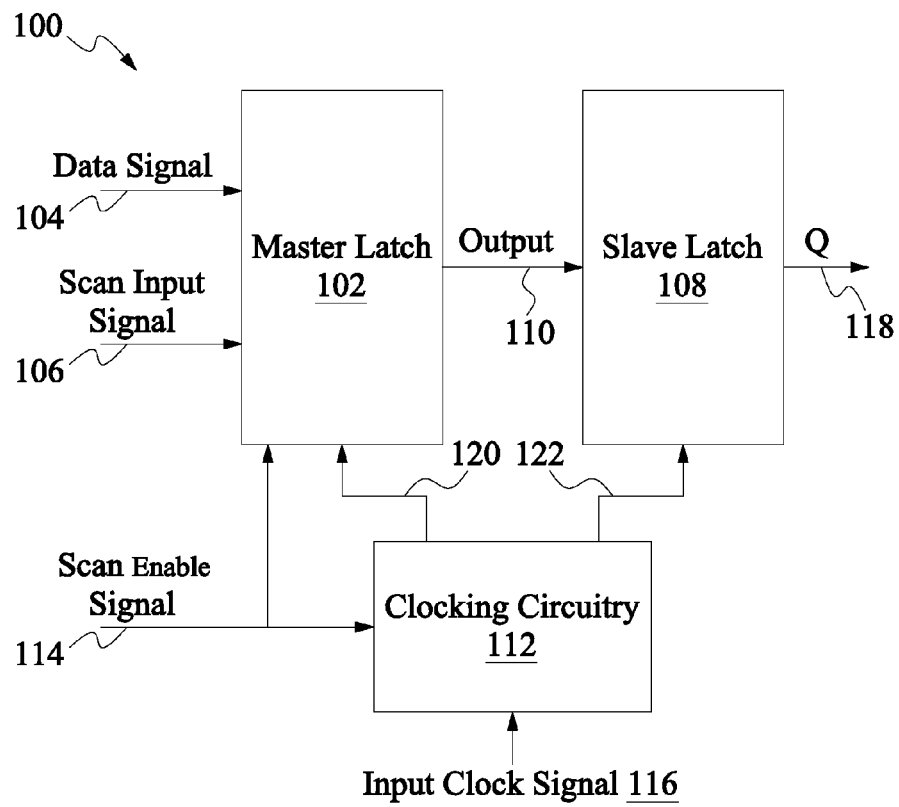
FIG. 1A depicts a block diagram of a skew-tolerant, scannable master-slave flip-flop, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A depicts a block diagram of a skew-tolerant, scannable master-slave flip-flop 100, in accordance with some embodiments. The flip-flop 100 includes a master latch 102 and a slave latch 108. The master latch 102 includes an input node configured to receive a data signal 104. In an example, the data signal 104 is propagated to the flip-flop 100 via combinatorial logic of a sequential circuit. The master latch 102 is further configured to receive a first clock signal 120. The first clock signal 120 is provided by clocking circuitry 112 and is based on an input clock signal 116 that is received by the clocking circuitry 112. The operation of the clocking circuitry 112 is described in further detail below.

The master latch 102 is further configured to receive a scan input signal 106 and a scan enable (SE) signal 114. When the SE signal 114 has a first logic level (e.g., when SE is inactive or low), the master latch 102 passes the data signal 104 to its output node 110. Conversely, when the SE signal 114 has a second logic level (e.g., when SE is active or high), the master latch 102 passes the scan input signal 106 to the output node 110. The assertion of the SE signal 114 with the second logic level is used to implement a scan testing mode of the flip-flop 100. In the scan testing mode, one or more test patterns of data are written to a plurality of flip-flops, such as the flip-flop 100 of FIG. 1A, that are typically arranged in a scan chain, and the test patterns are then read out to test the data storage functionality of the flip-flops.

The skew-tolerant, scannable master-slave flip-flop 100 of FIG. 1A further includes the slave latch 108, which is configured to receive the output 110 of the master latch 102. As described above, the master latch 102 selectively provides one of the data signal 104 or the scan input signal 106 to the slave latch 108 based on the SE signal 114 received by the master latch 102. Thus, in an example, depending on the SE signal 114, either the function data or the scan data is latched from the master latch 102 to the slave latch 108. The slave latch 108 is further configured to receive a second clock signal 122, which is provided by the clocking circuitry 112 and is based on the input clock signal 116. An output node 118 of the flip-flop 100 is included on the slave latch 108 and is used to read data out of the flip-flop 100. In an example, the flip-flop 100 comprises a storage cell that provides data storage (e.g., storage of one bit of data).

In an example embodiment, when the input clock signal 116 is low, the master latch 102 is transparent (e.g., ready to sample and store a data value) and the slave latch 108 is opaque (e.g., not sampling, but instead holding a previously sampled data value). In this embodiment, when the input clock signal 116 goes high, the master latch 102 becomes opaque, and the slave latch 108 becomes transparent to effect a positive edge-triggered behavior. Alternatively, in another example embodiment, when the input clock signal 116 is high, the master latch 102 is transparent and the slave latch 108 is opaque. In this embodiment, when the input clock signal 116 goes low, the master latch 102 becomes opaque, and the slave latch 108 becomes transparent to effect a negative edge-triggered behavior. Thus, the flip-flop 100 may be a positive edge-triggered flip-flop or a negative edge-triggered flip-flop. The approaches described below with reference to FIGS. 2A-5D may similarly be used to implement both positive edge-triggered flip-flops and negative edge-triggered flip-flops.

In conventional skew-tolerant flip-flops, skew tolerance is created by delaying in time the clock signal received by the master latch in comparison to the clock signal received by the slave latch. Specifically, in the conventional skew-tolerant flip-flops, the master clock signal is delayed relative to the slave clock signal regardless of whether the flip-flop is operating in a functional mode (e.g., when a scan enable signal is low) or a scan testing mode (e.g., when the scan enable signal is high). In other words, the master clock signal is delayed relative to the slave clock signal at all times in the conventional skew-tolerant flip-flop. A result of the delaying of the master clock relative to the slave clock in both functional and scan testing modes is hold time violations on the scan path (e.g., hold time violations resulting from the master and slave latches being driven by clocks with overlapping phases in the scan testing mode). To remedy such hold time violations in the conventional systems, additional circuitry (e.g., hold fixing overhead, which may include one or more inverters, for example) is added to the scan path. The circuitry added to the scan path generally consumes a significant amount of area and dissipates a significant amount of power. This area overhead and power dissipation are undesirable and are especially noticeable when two adjacent flip-flops on a same scan path are physically close to each other, for example.

In contrast to the conventional skew-tolerant flip-flops described above, the skew-tolerant flip-flop 100 of FIG. 1A, embodiments of which are described herein, implements an approach to clocking the master and slave latches 102, 108 that varies depending on a state (e.g., a logic level) of the SE signal 114. In other words, different clocking methodologies are utilized in the functional and scan testing modes of the flip-flop 100. By utilizing the different clocking methodologies depending on the SE signal 114, (i) in the functional mode, a master clock signal is delayed relative to a slave clock signal, and (ii) in the scan testing mode, the master and slave latches 102, 108 are driven by clocks having non-overlapping or substantially non-overlapping clock phases, thus eliminating or reducing the hold time violations on the scan path that are present in the conventional systems. With the hold time violations on the scan path being eliminated or reduced, a need for hold fixing overhead on the scan path is eliminated or reduced. Thus, the undesirable area overhead and power dissipation associated with the hold fixing overhead required by conventional skew-tolerant flip-flops (described above) are reduced in the flip-flops described herein.

"Non-overlapping clock phases," as referred to herein, are clock phases (i) that do not have a same logic level value at any time, and (ii) that do not have edge transitions that occur at different times. Thus, in non-overlapping clock phases, when a first clock phase has a first logic level value (e.g., "1"), a second clock phase has a second logic level value that is different from the first logic level value (e.g., "0"). Further, when the first clock phase is transitioning from the first logic level value to the second logic level value, the second clock phase is transitioning from the second logic level value to the first logic level value. All such transitions occur at the same time in non-overlapping clock phases. Non-overlapping clock phases are illustrated in FIGS. 4C and 4D, described below.

"Substantially non-overlapping clock phases," as referred to herein, differ from non-overlapping clock phases. Substantially non-overlapping clock phases include (i) some edge transitions that occur at the same times for the two clock phases, and (ii) other edge transitions that do not occur at the same times. Because some edge transitions do not occur at the same times, the substantially non-overlapping clock phases have a same logic level value at some times, in contrast to non-overlapping clock phases. Substantially non-overlapping clock phases are illustrated in FIGS. 1C and 1D, described below. In comparing the clock phases of FIGS. 1C and 1D, it can be seen that some edge transitions occur at same times (e.g., edge transitions 142, 152 occur at the same time), while other edge transitions occur at different times (e.g., edge transition 144 is delayed as compared to edge transition 154).

With reference again to FIG. 1A, in the functional mode (e.g., when the SE signal 114 is inactive or low), the clock signal 120 to the master latch 102 is delayed in time in comparison to the clock signal 122 to the slave latch 108. In the functional mode, the clock signal 120 does not include edge transitions that occur at same times as edge transitions of the clock signal 122, due to the delaying of the clock signal 120. By contrast, in the scan testing mode (e.g., when the SE signal 114 is active or high), the clock signal 120 to the master latch and the clock signal 122 to the slave latch 108 have non-overlapping or substantially non-overlapping clock phases. In the scan testing mode, the clock signal 120 includes edge transitions that occur at same times as edge transitions of the clock signal 122.

Figure 1B:
FIGS. 1B-1D depict phase diagrams of clock signals utilized in the skew-tolerant flip-flop of FIG. 1A, in accordance with some embodiments.
Figure 1C:
Figure 1D:
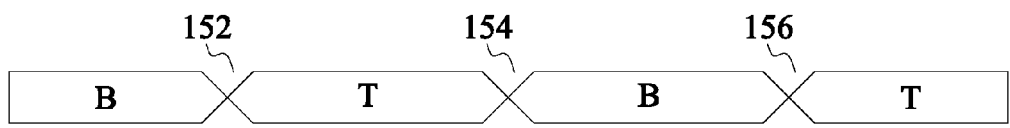

To illustrate the different clocking methodologies utilized in the flip-flop 100 depending on the state of the SE signal 114, reference is made to FIGS. 1B-1D. These figures depict phase diagrams of clock signals utilized in the skew-tolerant flip-flop 100 of FIG. 1A, in accordance with some embodiments. FIG. 1B depicts a phase diagram of a clock signal received by the master latch 102 in the functional mode, FIG. 1C depicts a phase diagram of a clock signal received by the master latch 102 in the scan testing mode, and FIG. 1D depicts a phase diagram of a clock signal received by the slave latch 108, regardless of whether the mode is the functional mode or the scan testing mode.

In the functional mode, the master latch 102 receives the clock signal 120 including edge transitions 132, 134, 136, as illustrated in FIG. 1B. The edge transitions cause the master latch 102 to switch between being transparent and opaque (i.e., blocking), as described above. In the functional mode, the slave latch 108 receives the clock signal 122 including edge transitions 152, 154, 156, as illustrated in FIG. 1D. In comparing the phase diagrams of FIGS. 1B and 1D, it can be seen that the clock signal 120 to the master latch 102 is delayed relative to the clock signal 122 to the slave latch 108. For example, edge transition 132 of the clock signal 120 is delayed relative to edge transition 152 of the clock signal 122; edge transition 134 is delayed relative to edge transition 154; and so on. With the edge transitions 132, 134, 136 delayed in time in comparison to the edge transitions 152, 154, 156, respectively, the clock signal 120 does not include edge transitions that occur at same times as edge transitions of the clock signal 122.

In this example, positive edge transitions of the clock signal 120 are delayed in time in comparison to negative edge transitions of the clock signal 122, and conversely, negative edge transitions of the clock signal 120 are delayed in time in comparison to positive edge transitions of the clock signal 122. Thus, for example, if the edge transition 152 of the clock signal 122 is a negative edge transition, the edge transition 132 of the clock signal 120, which is delayed relative to the edge transition 152, is a positive edge transition. Conversely, if the edge transition 152 of the clock signal 122 is a positive edge transition, the edge transition 132 of the clock signal 120 is a negative edge transition. Such edge transitions cause the master and slave latches 102, 108 to be transparent and opaque in the manner illustrated in the figures.

In the scan testing mode, the master latch 102 receives the clock signal 120 including edge transitions 142, 144, 146, as illustrated in FIG. 1C. In the scan testing mode, the slave latch 108 receives the clock signal 122 including the edge transitions 152, 154, 156, as illustrated in FIG. 1D. In comparing the phase diagrams of FIGS. 1C and 1D, it can be seen that the master and slave latches 102, 108 are driven by clocks having substantially non-overlapping clock phases, as described above. With the latches 102, 108 being driven by the substantially non-overlapping clock phases in this manner, the clock signal 120 includes edge transitions that occur at same times as edge transitions of the clock signal 122. For example, edge transition 142 of the clock signal 120 occurs at a same time as edge transition 152 of the clock signal 122. Similarly, edge transition 146 occurs at a same time as edge transition 156 of the clock signal 122. In the substantially non-overlapping clock phases, not all edge transitions occur at the same times (e.g., edge transition 144 is delayed as compared to edge transition 154), as noted above.

In this example, positive edge transitions of the clock signal 120 occur at same times as negative edge transitions of the clock signal 122, and conversely, negative edge transitions of the clock signal 120 occur at same times as positive edge transitions of the clock signal 122. Thus, for example, if the edge transition 152 of the clock signal 122 is a negative edge transition, the edge transition 142 of the clock signal 120, which occurs at the same time as the edge transition 152, is a positive edge transition. Conversely, if the edge transition 152 of the clock signal 122 is a positive edge transition, the edge transition 142 of the clock signal 120 is a negative edge transition. Such edge transitions cause the master and slave latches 102, 108 to be transparent and opaque in the manner illustrated in the figures.

With reference again to FIG. 1A, the clock signals 120, 122 provided to the master and slave latches 102, 108, respectively, are generated by the clocking circuitry 112. As explained in further detail below with respect to embodiments of the clocking circuitry 112, the clocking circuitry 112 is configured to receive the input clock signal 116 and the SE signal 114 and generate the clock signals 120, 122 based on one or both of the input clock signal 116 and the SE signal 114. In an example, the clocking circuitry 112 includes a first logic gate configured to (i) receive the SE signal 114 or an inverted version of the SE signal 114, and (ii) generate an output that varies based on a logic level of the SE signal 114 or the inverted version of the SE signal 114. In this example, the clocking circuitry 112 further includes a second logic gate configured to generate the clock signal 120 and/or the clock signal 122 based on the output of the first logic gate. Example embodiments of the clocking circuitry 112 including such logic gates are described below with reference to FIGS. 2A-5D.

Figure 2A:
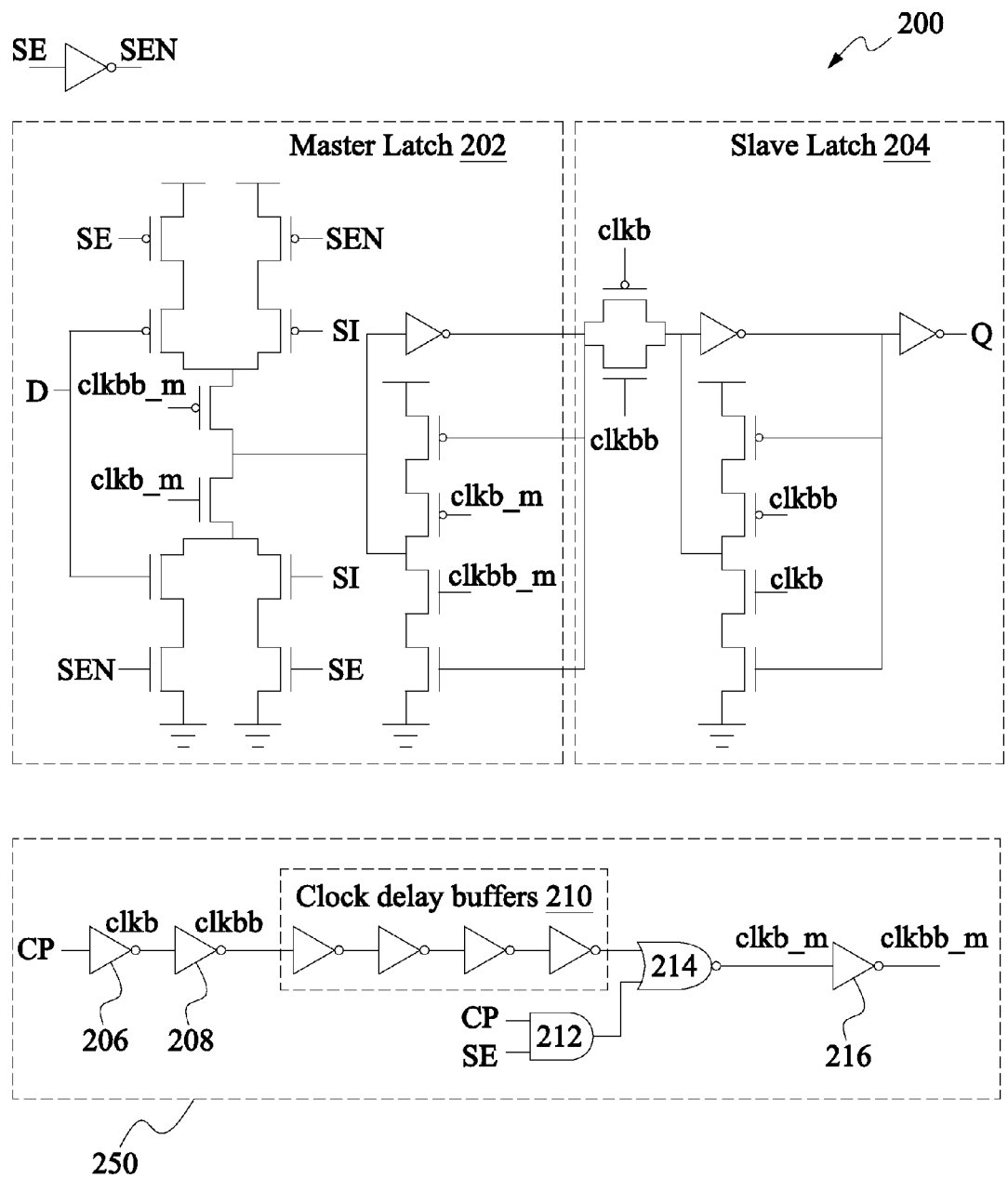
FIG. 2A is a circuit diagram depicting details of an exemplary master-slave latch configuration of a skew-tolerant flip-flop, in accordance with some embodiments.

FIG. 2A is a circuit diagram depicting details of an exemplary master-slave latch configuration of a skew-tolerant flip-flop 200, in accordance with some embodiments. The skew-tolerant flip-flop 200 includes a master latch 202 configured to receive a data signal (labeled "D" in FIG. 2A) and a scan input signal (labeled "SI"). The flip-flop 200 further includes a slave latch 204 coupled to the master latch 202. The master latch 202 is configured to selectively provide one of the data signal or the scan input signal to the slave latch 204 based on a scan enable signal (labeled "SE") received by the master latch 202. The master latch 202 also receives an inverted version of the scan enable signal (labeled "SEN").

In the example of FIG. 2A, the master latch 202 includes a plurality of NMOS and PMOS transistors and an inverter. The transistors and the inverter of the master latch 202 are coupled together in the configuration depicted in the figure to achieve the functionality of the master latch 102 described above with reference to FIG. 1A. The slave latch 204 of FIG. 2A similarly includes a plurality of NMOS and PMOS transistors and multiple inverters. The transistors and the inverters of the slave latch 204 are coupled together in the configuration depicted in the figure to achieve the functionality of the slave latch 108 described above with reference to FIG. 1A. The master and slave latches 202, 204 of FIG. 2A are examples only, and master and slave latches may be implemented in various other ways that are known to those of ordinary skill in the art.

The flip-flop 200 of FIG. 2A further includes circuitry 250 configured to receive the scan enable signal and generate multiple clock signals based on one or both of an input clock signal (labeled "CP" in FIG. 2A) and the scan enable signal. The clock signals generated by the circuitry 250 include (i) first clock signals (labeled "clkb_m" and "clkbb_m") that are provided to the master latch 202, and (ii) second clock signals (labeled "clkb" and "clkbb") that are provided to the slave latch 204. As illustrated in the figure, clkbb_m is an inverted version of clkb_m, and clkbb is an inverted version of clkb.

In FIG. 2A, the clkb_m and clkbb_m clock signals provided to the master latch 202 vary based on the logic level of the scan enable signal. Thus, for example, in a scan testing mode (e.g., scan enable signal high), the clkb_m and clkbb_m clock signals exhibit first characteristics (e.g., phase, timing), and in a functional mode (e.g., scan enable signal low), the clkb_m and clkbb_m clock signals exhibit differing, second characteristics. The differing characteristics of the clkb_m and clkbb_m clock signals in the two modes can be seen in comparing FIGS. 2B and 2C, described below. By contrast, in this example, the clock signals clkb and clkbb provided to the slave latch 204 do not vary based on the logic level of the scan enable signal.

The circuitry 250 includes an AND logic gate 212 configured to receive the input clock signal and the scan enable signal. The AND logic gate 212 generates a first output based on a logical combination of the input clock signal and the scan enable signal. The circuitry 250 further includes clock delay buffers 210 that comprise a plurality of serially-connected inverters. The serially-connected inverters may be referred to as a "clock chain." The clock delay buffers 210 are configured to receive the clkbb signal (i.e., one of the second clock signals that are provided to the slave latch 204) and to generate a second output that is a delayed version of the clkbb signal. The delaying of the clkbb signal is achieved by the serially-coupled inverters of the clock delay buffers 210, each of which imparts an amount of delay on the signal as it propagates through the inverter. The clock delay buffers depicted in FIGS. 2A, 3A, 4A, and 5A (having reference numerals 210, 310, 410, and 512, respectively) are examples only, and the clock delay buffers utilized in the approaches herein may include any number of serially-coupled inverters. Thus, for example, although the clock delay buffers 210 of FIG. 2A utilize four serially-coupled inverters, in other examples, the example of FIG. 2A may utilize clock delay buffers with a different number of serially-coupled inverters (e.g., 2, 8, etc.). Other ways of forming the clock delay buffers 210 are within the scope of this disclosure.

The circuitry 250 further includes a NOR logic gate 214 configured to receive the first and second outputs and to generate a third output based on a logical combination of the first and second outputs. As shown in the figure, the first clock signals clkb_m and clkbb_m provided to the master latch 202 are based on the third output generated by the NOR logic gate 214. Specifically, the clkb_m clock signal is the third output of the NOR logic gate 214, and the clkbb_m clock signal is an inverted version of the clkb_m signal that is generated by an inverter 216.

The circuitry 250 further includes an inverter 206 that is configured to receive the input clock signal and to generate a fourth output that is an inverted version of the input clock signal. An inverter 208 is serially-coupled to the inverter 206 and is configured to receive the fourth output. The inverter 208 generates a fifth output that is an inverted version of the fourth output. As illustrated in the figure, the second clock signals clkb and clkbb provided to the slave latch 204 are based on the fourth and fifth outputs, respectively. Specifically, the clkb clock signal is the fourth output generated by the inverter 206, and the clkbb clock signal is the fifth output generated by the inverter 208.

In FIG. 2A, when the scan enable signal has a logic level low value, the AND logic gate 212 outputs a logic level low value, which is received by the NOR gate 214. When receiving this logic level low value from the AND logic gate 212, the NOR logic gate 214 functions as an inverter and thus generates an inverted version of the second output produced by the clock delay buffers 210. The second output produced by the clock delay buffers 210 is a delayed version of the clkbb clock signal. Thus, the clkbb_m clock signal provided to the master latch 202 is a delayed version of the clkbb clock signal, and the clkb_m clock signal provided to the master latch 202 is an inverted, delayed version of the clkbb clock signal. When the scan enable signal has the logic level low value, the clkb_m and clkbb_m signals provided to the master latch 202 are delayed in time relative to the clkb and clkb_m signals provided to the slave latch 204, respectively.

Figure 2B:
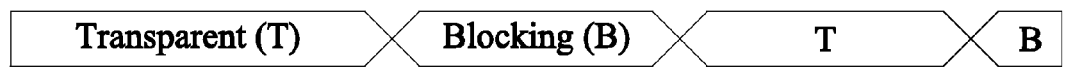
FIGS. 2B-2D depict phase diagrams of clock signals utilized in the example skew-tolerant flip-flop of FIG. 2A, in accordance with some embodiments.
Figure 2C:
Figure 2D:
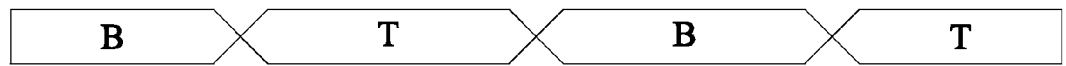

To illustrate the delaying of the clock signals provided to the master latch 202 relative to the clock signals provided to the slave latch 204 when the scan enable signal has the logic level low value, reference is made to FIGS. 2B and 2D. FIG. 2B depicts a phase diagram of clock signals provided to the master latch 202 when the scan enable signal has the logic level low value, and FIG. 2D depicts a phase diagram of clock signals provided to the slave latch 204, regardless of whether the scan enable signal has a logic level high or low value. The clock signals associated with the phase diagram of FIG. 2B are the clkb_m and clkbb_m signals, and the clock signals associated with the phase diagram of FIG. 2D are the clkb and clkbb signals, in an example.

In comparing the phase diagrams of FIGS. 2B and 2D, it can be seen that the clock signals to the master latch 202 (as represented in FIG. 2B) are delayed relative to the clock signals to the slave latch 204 (as represented in FIG. 2D). As shown in the figures, edge transitions of the clock signals to the master latch 202 are delayed relative to edge transitions of the clock signals to the slave latch 204. With the edge transitions received by the master latch 202 being delayed in time relative to the edge transitions received by the slave latch 204, the clock signals received by the master latch 202 do not include edge transitions that occur at same times as edge transitions of the clock signal received by the slave latch 204.

With reference again to the example of FIG. 2A, when the scan enable signal has a logic level high value, the AND logic gate 212 passes the input clock signal (labeled "CP" in the figure) to the NOR logic gate 214. When the scan enable signal has the logic level high value, the NOR logic gate 214 thus receives (i) the input clock signal at a first input node, and (ii) the second output produced by the clock delay buffers 210 at a second input node. The second output produced by the clock delay buffers 210 is a delayed version of the clkbb clock signal. Thus, when the scan enable signal has the logic level high value, the clkb_m clock signal provided to the master latch 202 is a logical NOR of the input clock signal and the delayed version of the clkbb clock signal. The clkbb_m clock signal is an inverted version of the clkb_m clock signal. The generation of the clkb_m and clkbb_m clock signals in this manner causes the clock signals provided to the master latch 202 and the clock signals provided to the slave latch 204 to have substantially non-overlapping phases.

To illustrate the generation of master and slave latch clock signals having substantially non-overlapping phases when the scan enable signal has the logic level high value, reference is made to FIGS. 2C and 2D. FIG. 2C depicts a phase diagram of clock signals provided to the master latch 202 when the scan enable signal has the logic level high value. FIG. 2D depicts the phase diagram of the clock signals provided to the slave latch 204, regardless of whether the scan enable signal has the logic level high or low value, as noted above. The clock signals associated with the phase diagram of FIG. 2C are the clkb_m and clkbb_m signals, and the clock signals associated with the phase diagram of FIG. 2D are the clkb and clkbb signals, in an example.

In comparing the phase diagrams of FIGS. 2C and 2D, it can be seen that the master and slave latches 202, 204 are driven by clocks having substantially non-overlapping clock phases. With the latches 202, 204 being driven by the substantially non-overlapping clock phases in this manner, the clock signals provided to the master latch 202 include edge transitions that occur at same times as edge transitions of the clock signals provided to the slave latch 204.

Although the example of FIG. 2A implements a positive edge-triggered flip-flop, this disclosure is not limited to positive edge-triggered flip-flops. Thus, the teachings and approach of FIG. 2A described above can be used in implementing a negative edge-triggered flip-flop. Similarly, embodiments described below with reference to FIGS. 3A-5D implement positive edge-triggered flip-flops, but the teachings and approaches of these figures (described below) can be used in implementing negative edge-triggered flip-flops.

Figure 3A:
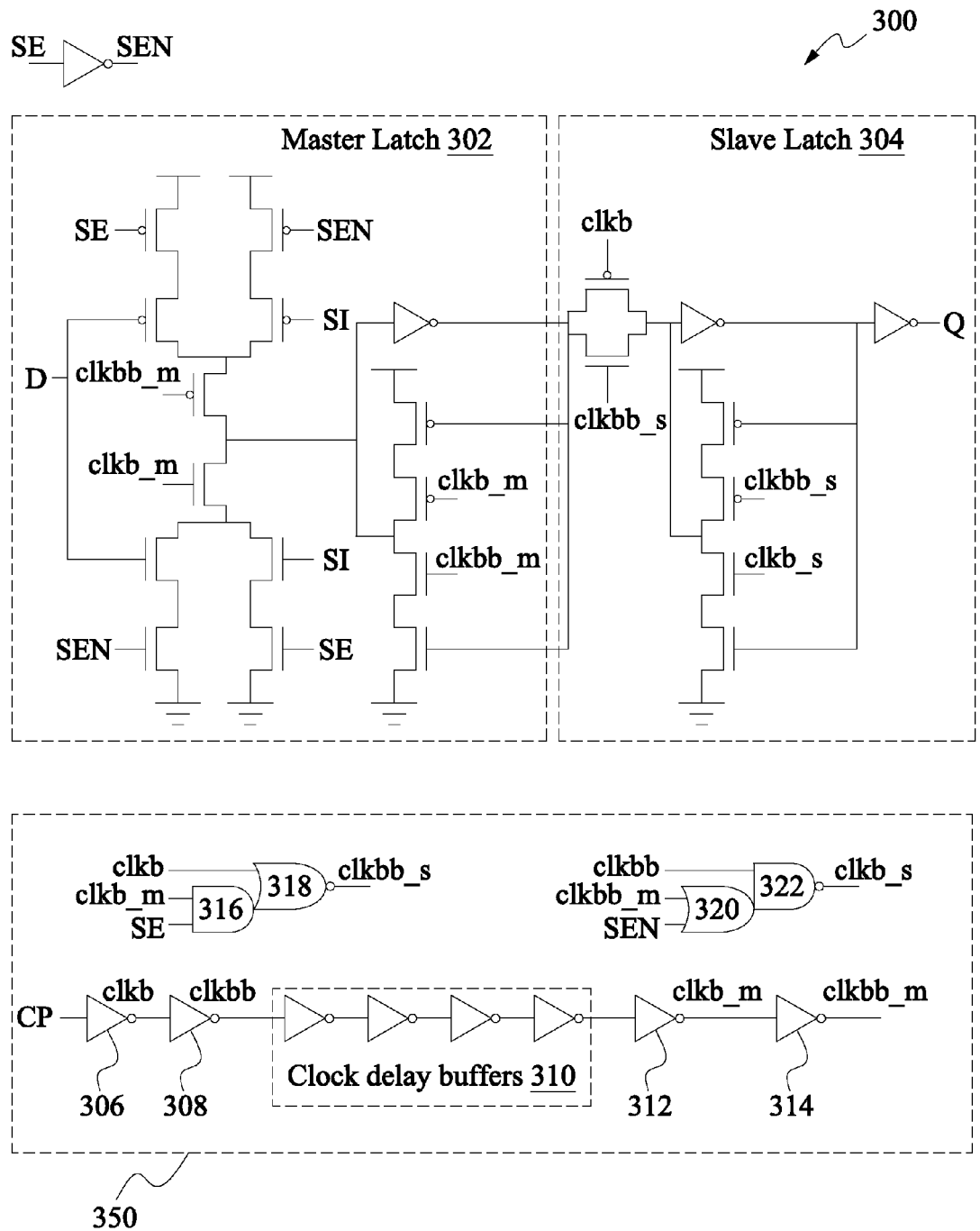
FIG. 3A depicts a circuit diagram of an example skew-tolerant flip-flop, in accordance with some embodiments.

FIG. 3A depicts a circuit diagram of an example skew-tolerant flip-flop 300, in accordance with some embodiments. The skew-tolerant flip-flop 300 includes a master latch 302 and a slave latch 304 coupled to the master latch 302. The master latch 302 is the same as the master latch 202 of FIG. 2A, and the master latch 302 receives the same signals as the master latch 202. The slave latch 304 is the same as the slave latch 204 of FIG. 2A, but the slave latch 304 receives different signals than the slave latch 204. Specifically, as described below, the slave latch 304 of FIG. 3A receives clock signals "clkb_s" and "clkbb_s," whereas the slave latch 204 of FIG. 2A receives clock signals "clkb" and "clkbb."

The flip-flop 300 of FIG. 3A further includes circuitry 350 configured to receive the scan enable signal and generate multiple clock signals based on one or both of an input clock signal (labeled "CP" in FIG. 3A) and the scan enable signal. The clock signals generated by the circuitry 350 include (i) first clock signals (labeled "clkb_m" and "clkbb_m") that are provided to the master latch 302, and (ii) second clock signals (labeled "clkb_s" and "clkbb_s") that are provided to the slave latch 304. As illustrated in the figure, clkbb_m is an inverted version of clkb_m generated by an inverter 314. In the circuitry 350, an inverter 306 inverts the input clock signal to generate a signal clkb, and an inverter 308 inverts the signal clkb to generate a signal clkbb.

In FIG. 3A, the clkb_s and clkbb_s clock signals provided to the slave latch 304 vary based on the logic level of the scan enable signal. Thus, for example, in a scan testing mode (e.g., scan enable signal high), the clkb_s and clkbb_s clock signals exhibit first characteristics (e.g., phase, timing), and in a functional mode (e.g., scan enable signal low), the clkb_s and clkbb_s clock signals exhibit differing, second characteristics. The differing characteristics of the clkb_s and clkbb_s clock signals in the two modes can be seen in comparing FIGS. 3C and 3D, described below. By contrast, in this example, the clock signals clkb_m and clkbb_m provided to the master latch 302 do not vary based on the logic level of the scan enable signal.

The circuitry 350 includes clock delay buffers 310 that comprise a plurality of serially-connected inverters and is configured to receive the clkbb signal and to generate a delayed version of the clkbb signal. Other ways of forming the clock delay buffers 310 (e.g., not including a plurality of serially-connected inverters) are within the scope of this disclosure. The delayed version of the clkbb signal is inverted by an inverter 312 to generate the clkb_m signal. The circuitry 350 further includes an AND logic gate 316 configured to receive the clkb_m signal and the scan enable signal. The AND logic gate 316 generates a first output based on a logical combination of the clkb_m signal and the scan enable signal. As is evident from the circuit diagram, the clkb_m signal comprises a delayed version of the input clock signal that has been inverted. A NOR logic gate 318 is configured to receive the first output and the clkb signal, which is an inverted version of the input clock signal. The NOR logic gate 318 generates a second output based on a logical combination of the first output and the clkb signal. The clkbb_s clock signal provided to the slave latch 304 is equal to the second output of the NOR logic gate 318.

The circuitry 350 further includes an OR logic gate 320 configured to receive the clkbb_m signal and the inverted version of the scan enable signal ("SEN"). The OR logic gate 320 generates a third output based on a logical combination of the clkbb_m signal and the inverted version of the scan enable signal. As is evident from the circuit diagram, the clkbb_m signal comprises a delayed version of the input clock signal. A NAND logic gate 322 is configured to receive (i) the third output, and (ii) the clkbb signal. The NAND logic gate 322 generates a fourth output based on a logical combination of the third output and the clkbb signal. The clkb_s clock signal provided to the slave latch 304 is equal to the fourth output of the NAND logic gate 322.

In FIG. 3A, when the scan enable signal has a logic level low value, the AND logic gate 316 outputs a logic level low value, which is received by the NOR logic gate 318. When receiving this logic level low value from the AND logic gate 316, the NOR logic gate 318 functions as an inverter and thus generates an inverted version of the clkb signal produced by the inverter 306. Further, when the scan enable signal has the logic level low value, the OR logic gate 320 outputs a logic level high value, which is received by the NAND logic gate 318. When receiving this logic level high value from the OR logic gate 320, the NAND logic gate 322 functions as an inverter and thus generates an inverted version of the clkbb signal produced by the inverter 308. Thus, when the scan enable signal has the logic level low value, the clkb_s and clkbb_s signals provided to the slave latch 304 are merely inverted versions of the clkbb and clkb signals, respectively. The clkbb and clkb signals are based on the input clock signal CP, as shown in the circuit diagram.

When the scan enable signal has a logic level high value, the AND logic gate 316 passes the clkb_m clock signal to the NOR logic gate 318. When the scan enable signal has the logic level high value, the NOR logic gate 318 thus receives (i) the clkb signal at a first input node, and (ii) the clkb_m signal at a second input node. The clkb_m clock signal is a delayed version of the input clock signal that has been inverted. Thus, when the scan enable signal has the logic level high value, the clkbb_s clock signal provided to the slave latch 304 is a logical NOR of the clkb signal and the delayed version of the input clock signal that has been inverted (i.e., the clkb_m signal). Further, when the scan enable signal has a logic level high value, the OR logic gate 320 passes the clkbb_m clock signal to the NAND logic gate 322. When the scan enable signal has the logic level high value, the NAND logic gate 322 thus receives (i) the clkbb signal at a first input node, and (ii) the clkbb_m signal at a second input node. The clkbb_m clock signal is a delayed version of the input clock signal. Thus, when the scan enable signal has the logic level high value, the clkb_s clock signal provided to the slave latch 304 is a logical NAND of the clkbb signal and the delayed version of the input clock signal (i.e., the clkbb_m signal). The generation of the clkbb_s and clkb_s clock signals in this manner causes the clock signals provided to the master latch 302 and the clock signals provided to the slave latch 304 to have substantially non-overlapping phases.

Figure 3B:
FIGS. 3B-3D depict phase diagrams of clock signals utilized in the example skew-tolerant flip-flop of FIG. 3A, in accordance with some embodiments.
Figure 3C:

To illustrate the generation of master and slave latch clock signals having substantially non-overlapping phases when the scan enable signal has the logic level high value, reference is made to FIGS. 3B and 3C. FIG. 3B depicts a phase diagram of clock signals provided to the master latch 302, regardless of whether the scan enable signal has the logic level high or low value. FIG. 3C depicts a phase diagram of clock signals provided to the slave latch 304 when the scan enable signal has the logic level high value. The clock signals associated with the phase diagram of FIG. 3B are the clkb_m and clkbb_m signals, and the clock signals associated with the phase diagram of FIG. 3C are the clkb_s and clkbb_s signals, in an example. In comparing the phase diagrams of FIGS. 3B and 3C, it can be seen that the master and slave latches 302, 304 are driven by clocks having substantially non-overlapping clock phases. With the latches 302, 304 being driven by the substantially non-overlapping clock phases in this manner, the clock signals provided to the master latch 302 include edge transitions that occur at same times as edge transitions of the clock signals provided to the slave latch 304.

Figure 3D:

FIG. 3D depicts a phase diagram of clock signals provided to the slave latch 304 when the scan enable signal has a logic level low value. The clock signals associated with the phase diagram of FIG. 3D are the clkb_s and clkbb_s signals. As noted above, when the scan enable signal has the logic level low value, the clkb_s and clkbb_s signals provided to the slave latch 304 are merely inverted versions of the clkbb and clkb signals, respectively, and the clkbb and clkb signals are based on the input clock signal, as shown in the circuit diagram of FIG. 3A. In comparing the phase diagrams of FIGS. 3B and 3D, it can be seen that the clock signals to the master latch 302 (as represented in FIG. 3B) are delayed relative to the clock signals to the slave latch 304 (as represented in FIG. 3D). As shown in the figures, edge transitions of the clock signals to the master latch 302 are delayed relative to edge transitions of the clock signals to the slave latch 304.

Figure 4A:
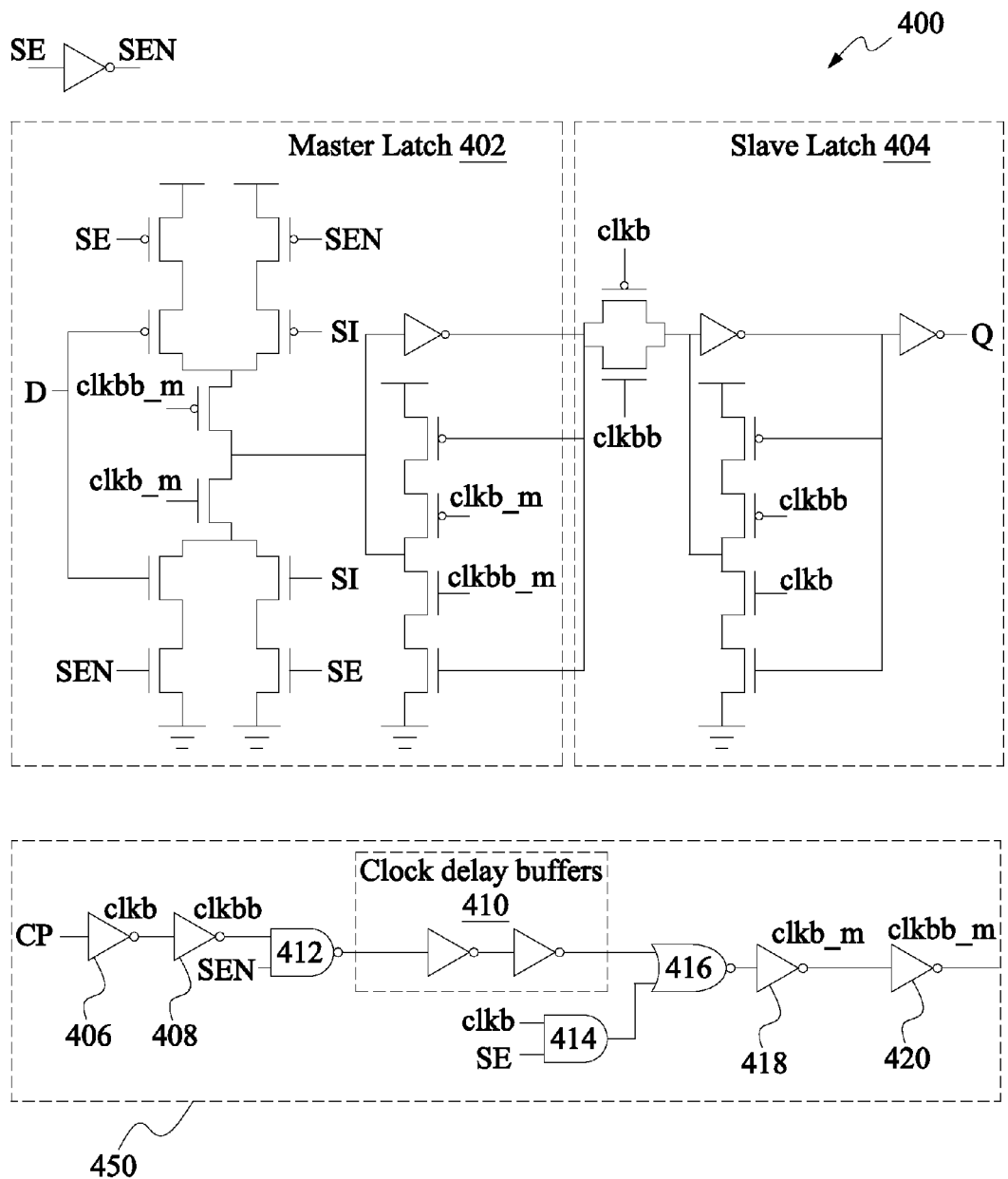
FIG. 4A depicts a circuit diagram of an example skew-tolerant flip-flop, in accordance with some embodiments.

FIG. 4A is a circuit diagram depicting details of an exemplary master-slave latch configuration of a skew-tolerant flip-flop 400, in accordance with some embodiments. The skew-tolerant flip-flop 400 includes a master latch 402 and a slave latch 404 coupled to the master latch 402. The master latch 402 is the same as the master latch 202 of FIG. 2A, and the master latch 402 receives the same signals as the master latch 202. The slave latch 404 is the same as the slave latch 204 of FIG. 2A, and the slave latch 404 receives the same signals as the slave latch 204.

The flip-flop 400 of FIG. 4A further includes circuitry 450 configured to receive the scan enable signal and generate multiple clock signals based on one or both of an input clock signal (labeled "CP" in FIG. 4A) and the scan enable signal. The clock signals generated by the circuitry 450 include (i) first clock signals (labeled "clkb_m" and "clkbb_m") that are provided to the master latch 402, and (ii) second clock signals (labeled "clkb" and "clkbb") that are provided to the slave latch 404.

In FIG. 4A, the clkb_m and clkbb_m clock signals provided to the master latch 402 vary based on the logic level of the scan enable signal. Specifically, in a functional mode (e.g., scan enable signal low), the clkb_m and clkbb_m clock signals include edge transitions that are delayed in time in comparison to edge transitions of the clkb and clkbb signals. By contrast, in a scan testing mode (e.g., scan enable signal high), the clkb_m and clkbb_m clock signals comprise inverted versions of the clock signals provided to the slave latch 404. The different characteristics of the clkb_m and clkbb_m signals in the two modes can be seen in FIGS. 4B-4D, described below. By contrast, in this example, the clock signals clkb and clkbb provided to the slave latch 404 do not vary based on the logic level of the scan enable signal.

The circuitry 450 includes a first inverter 406 that is configured to receive the input clock signal and to generate a first output that is an inverted version of the input clock signal. In the example of FIG. 4A, the first output is the clkb clock signal that is provided to the slave latch 404. A second inverter 408 is serially-coupled to the first inverter 406 and is configured to receive the first output and to generate a second output that is an inverted version of the first output. In the example of FIG. 4A, the first output is the clkbb clock signal that is provided to the slave latch 404. The circuitry 450 further includes a NAND logic gate 412 that is configured to receive the second output (i.e., the clkbb clock signal) and an inverted version of the scan enable signal ("SEN"). The NAND logic gate 412 generates a third output based on a logical combination of the second output and the inverted version of the scan enable signal.

The circuitry 450 also includes clock delay buffers 410 that comprise a plurality of serially-connected inverters. Other ways of forming the clock delay buffers 410 are within the scope of this disclosure. The clock delay buffers 410 are configured to receive the third output and to generate a fourth output that is a delayed version of the third output. An AND logic gate 414 is configured to receive the clkb clock signal generated by the first inverter 406 and the scan enable signal. The AND logic gate 414 generates a fifth output based on a logical combination of the clkb signal and the scan enable signal. The circuitry 450 further includes a NOR logic gate 416 configured to receive the output generated by the clock delay buffers 410 (i.e., the fourth output) and the output generated by the AND logic gate 414 (i.e., the fifth output). The NOR logic gate 416 generates a sixth output based on a logical combination of the fourth and fifth outputs. The sixth output generated by the NOR logic gate 416 is inverted by a third inverter 418, with an output of the third inverter 418 being the clkb_m clock signal provided to the master latch 402. The clkb_m clock signal is inverted by a fourth inverter 420 to generate the clkbb_m clock signal provided to the master latch 402.

In FIG. 4A, when the scan enable signal has a logic level high value, the SEN signal has a logic level low value, thus causing the NAND logic gate 412 to output a logic level high value. In an example in which the clock delay buffers 410 comprise an odd number of serially-coupled inverters, an output of the clock delay buffers 410 when the scan enable signal has a logic level high value is a logic level low value. The NOR logic gate 416 acts as an inverter based upon its receipt of the logic level low value from the clock delay buffers 410. The AND gate 414 outputs the clkb signal when the scan enable signal has the logic level high value. The NOR logic gate 416 receives the clkb signal from the AND gate 414 and outputs an inverted version of the clkb signal, due to the NOR logic gate 416 being configured to function as an inverter (as noted above). The inverters 418, 420 cause (i) the clkb_m signal to be an inverted version of the clkbb signal, and (ii) the clkbb_m signal to be an inverted version of the clkb signal. In the scan testing mode (i.e., when SE is high), the clock signals provided to the master latch 402 are merely inverted versions of the clock signals provided to the slave latch 404. The clock signals provided to the master latch 402 are not delayed relative to the clock signals provided to the slave latch 404 in the scan testing mode.

To illustrate the clock signals in the scan testing mode in the example of FIG. 4A, reference is made to FIGS. 4C and 4D. FIG. 4C depicts a phase diagram of clock signals provided to the master latch 402 when the scan enable signal has the logic level high value, and FIG. 4D depicts a phase diagram of clock signals provided to the slave latch 404, regardless of whether the scan enable signal has a logic level high or low value. The clock signals associated with the phase diagram of FIG. 4C are the clkb_m and clkbb_m signals, and the clock signals associated with the phase diagram of FIG. 4D are the clkb and clkbb signals, in an example. In comparing the phase diagrams of FIGS. 4C and 4D, it can be seen that the clock signals to the master latch 402 are merely inverted versions of the clock signals to the slave latch 404. Further, it can be seen that the master and slave latches 402, 404 are driven by clocks having non-overlapping clock phases in the scan testing mode.

With reference again to the example of FIG. 4A, when the scan enable signal has the logic level low value, the SEN signal has a logic level high value, thus causing the NAND logic gate 412 to act as an inverter. The NAND logic gate 412 thus outputs an inverted version of the clkbb clock signal when the scan enable signal has the logic level low value. The inverted version of the clkbb clock signal undergoes a delay as a result of the clock delay buffers 410. The AND logic gate 414 outputs a logic level low value when the scan enable signal has the logic level low value. The NOR logic gate 416 functions as an inverter based on its receipt of the logic level low value from the AND logic gate 414.

Functioning as an inverter, the NOR logic gate 416 outputs an inverted version of the signal received from the clock delay buffers 410, where the signal received from the clock delay buffers 410 is a delayed version of the clkbb clock signal. The clkb_m and clkbb_m clock signals provided to the master latch 402 are thus based on the delayed version of the clkbb clock signal when the scan enable signal has the logic level low value.

Figure 4B:
FIGS. 4B-4D depict phase diagrams of clock signals utilized in the example skew-tolerant flip-flop of FIG. 4A, in accordance with some embodiments.
Figure 4C:
Figure 4D:

To illustrate the delaying of the clock signals provided to the master latch 402 relative to the clock signals provided to the slave latch 404 when the scan enable signal has the logic level low value, reference is made to FIGS. 4B and 4D. FIG. 4B depicts a phase diagram of clock signals provided to the master latch 402 when the scan enable signal has the logic level low value, and FIG. 4D depicts the phase diagram of clock signals provided to the slave latch 404, regardless of whether the scan enable signal has a logic level high or low value, as noted above. In comparing the phase diagrams of FIGS. 4B and 4D, it can be seen that the clock signals to the master latch 402 (as represented in FIG. 4B) are delayed relative to the clock signals to the slave latch 404 (as represented in FIG. 4D). As shown in the figures, edge transitions of the clock signals to the master latch 402 are delayed relative to edge transitions of the clock signals to the slave latch 404. With the edge transitions received by the master latch 402 being delayed in time relative to the edge transitions received by the slave latch 404, the clock signals received by the master latch 402 do not include edge transitions that occur at same times as edge transitions of the clock signal received by the slave latch 404.

Figure 5A:
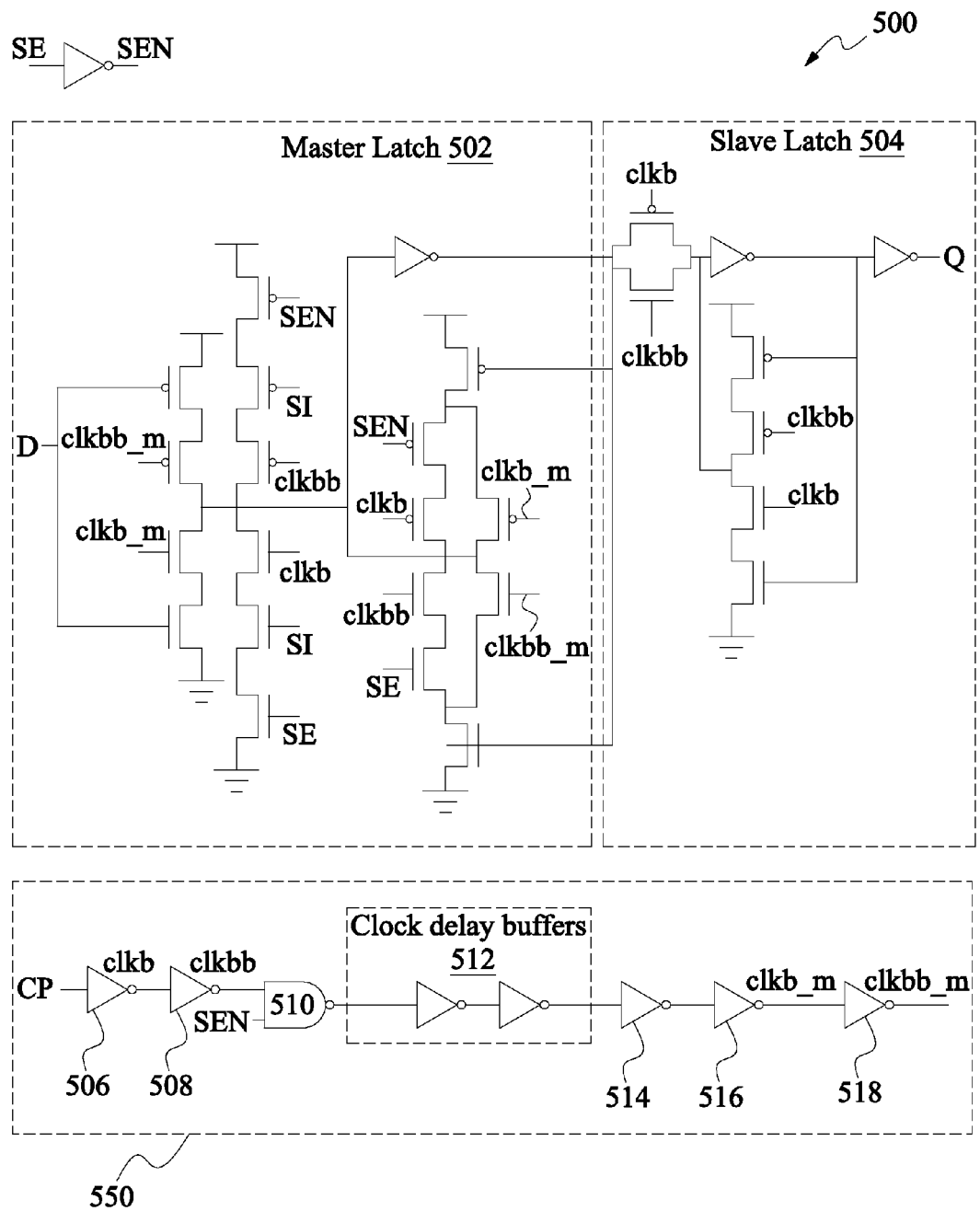
FIG. 5A depicts a circuit diagram of an example skew-tolerant flip-flop, in accordance with some embodiments.

FIG. 5A is a circuit diagram depicting details of an exemplary master-slave latch configuration of a skew-tolerant flip-flop 500, in accordance with some embodiments. The skew-tolerant flip-flop 500 includes a master latch 502 and a slave latch 504 coupled to the master latch 502. The flip-flop 500 of FIG. 5A further includes circuitry 550. The circuitry 550 includes a first inverter 506 that is configured to receive the input clock signal ("CP") and to generate a first output that is an inverted version of the input clock signal. The first output is the clkb clock signal provided to the slave latch 504. A second inverter 508 serially-coupled to the first inverter 506 is configured to receive the clkb signal and to generate a second output that is an inverted version of the clkb signal. The second output is the clkbb clock signal provided to the slave latch 504. The circuitry 550 further includes a NAND logic gate 510 configured to receive the clkbb clock signal and an inverted version of the scan enable signal ("SEN"). The NAND logic gate 510 generates a third output based on a logical combination of the clkbb signal and the inverted version of the scan enable signal.

The circuitry 550 also includes clock delay buffers 512 that comprise a plurality of serially-connected inverters. Other ways of forming the clock delay buffers 512 are within the scope of this disclosure. The clock delay buffers are configured to receive the third output from the NAND logic gate 510 and to generate a fourth output that is a delayed version of the third output. A third inverter 514 is configured to receive the fourth output from the clock delay buffers 512, and the third inverter 514 generates a fifth output that is an inverted version of the fourth output. A fourth inverter 516 of the circuitry 550 is configured to receive the fifth output and to generate a sixth output that is an inverted version of the fifth output. The sixth output is the clkb_m clock signal provided to the master latch 502. A fifth inverter 518 receives and inverts the clkb_m clock signal to generate the clkbb_m clock signal.

In the example of FIG. 5A, an inverted slave clock is used as a master scan clock by manipulating the scan control in the flip-flop 500. The operation of the flip-flop 500 of FIG. 5A differs in comparison to that of the flip-flops 200, 300, and 400 of FIGS. 2A, 3A, and 4A, respectively. In the flip-flops 200, 300, and 400, clock signals are manipulated based on a state of the scan enable signal, with the manipulating of the clock signals being used to effectuate the different clocking methodologies in the functional and scan testing modes. By contrast, in the flip-flop 500 of FIG. 5A, a structure of the master latch 502 is different in comparison to the master latches of the flip-flops 200, 300, and 400. Specifically, in the master latches of the flip-flops 200, 300, and 400, the data ("D") and scan enable ("SE") signals were controlled by the same clock signal. By contrast, in the master latch 502 of FIG. 5A, the data signal is controlled by the clkb_m and clkbb_m clock signals, while the scan enable signal is controlled by the clkb and clkbb clock signals. This is evident in the circuit diagram of FIG. 5A, which shows the data signal being received at a first stack of coupled NMOS and PMOS transistors and the scan enable signal being received at a second stack of coupled NMOS and PMOS transistors.

Figure 5B:
FIGS. 5B-5D depict phase diagrams of clock signals utilized in the example skew-tolerant flip-flop of FIG. 5A, in accordance with some embodiments.
Figure 5C:
Figure 5D:

In FIG. 5A, when the scan enable signal has a logic level low value, the clock signals provided to the master latch 502 are delayed relative to the clock signals provided to the slave latch 504. To illustrate this, reference is made to FIGS. 5B and 5D. FIG. 5B depicts a phase diagram of clock signals provided to the master latch 502 when the scan enable signal has the logic level low value, and FIG. 5D depicts a phase diagram of clock signals provided to the slave latch 504, regardless of whether the scan enable signal has a logic level high or low value. In comparing the phase diagrams of FIGS. 5B and 5D, it can be seen that the clock signals to the master latch 502 (as represented in FIG. 5B) are delayed relative to the clock signals to the slave latch 504 (as represented in FIG. 5D).

Alternatively, when the scan enable signal has a logic level high value, the clock signals to the master latch 502 are inverted versions of the clock signals to the slave latch 504, as generated by manipulating the scan control in the flip-flop 500, as described above. To illustrate this, reference is made to FIGS. 5C and 5D. FIG. 5C depicts a phase diagram of clock signals provided to the master latch 502 when the scan enable signal has the logic level high value, and FIG. 5D depicts the phase diagram of clock signals provided to the slave latch 504, regardless of whether the scan enable signal has a logic level high or low value, as noted above. In comparing the phase diagrams of FIGS. 5C and 5D, it can be seen that the clock signals to the master latch 502 are merely inverted versions of the clock signals to the slave latch 504. Further, it can be seen that the master and slave latches 502, 504 are driven by clocks having non-overlapping clock phases in the scan testing mode.

Figure 6:
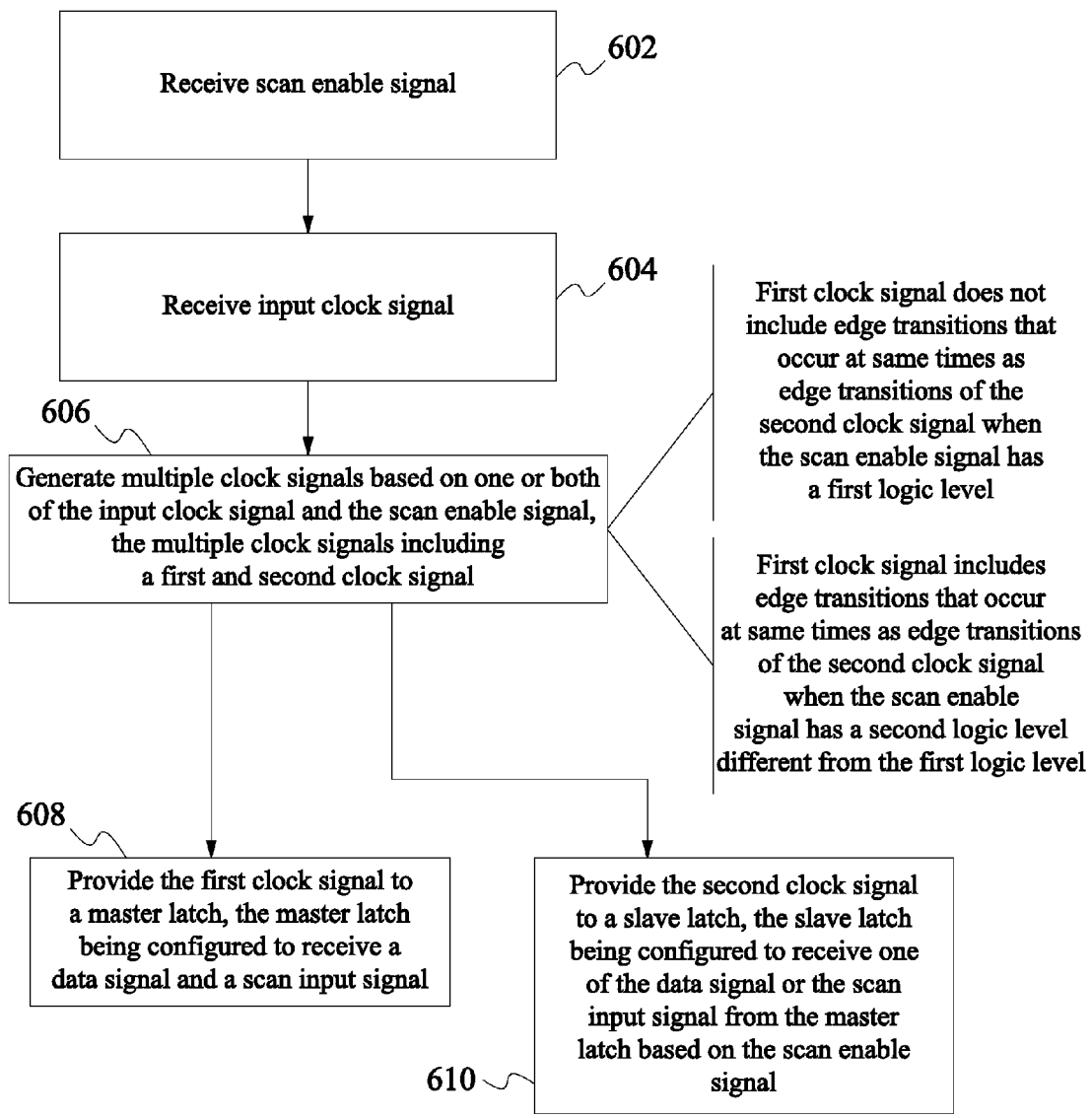
FIG. 6 is a flowchart depicting example steps of a method for providing clock signals to a flip-flop having a master latch and a slave latch, in accordance with some embodiments.

FIG. 6 is a flowchart depicting example steps of a method for providing clock signals to a flip-flop having a master latch and a slave latch, in accordance with some embodiments. At 602, a scan enable signal is received. This step is shown in the example of FIG. 2A, which shows the AND logic gate 212 of the circuitry 250 receiving a scan enable signal (labeled "SE"). The examples of FIGS. 3A and 4A similarly show components of the circuits 350 and 450, respectively, receiving scan enable signals. The example of FIG. 5A shows a scan enable signal being received by components of the master latch 502. Further, an inverted version of the scan enable signal is received by components of the master latch 502 and by the NAND logic gate 510 of the circuitry 550 in the example of FIG. 5A.

At 604, an input clock signal is received. This step is shown in the example of FIG. 2A, which shows an input clock signal (labeled "CP") being received by the inverter 206 of the circuitry 250. The examples of FIGS. 3A, 4A, and 5A similarly show components of the circuits 350, 450, and 550, respectively, receiving input clock signals. Although the flowchart of FIG. 6 depicts the scan enable signal as being received before the input clock signal, in other examples, the scan enable signal and the input clock signal are received at the same time. Further, in other examples, the input clock signal is received before the scan enable signal.

At 606, multiple clock signals are generated based on one or both of the input clock signal and the scan enable signal, with the multiple clock signals including a first and second clock signal. In an example, the first clock signal does not include edge transitions that occur at same times as edge transitions of the second clock signal when the scan enable signal has a first logic level. The first clock signal includes edge transitions that occur at same times as edge transitions of the second clock signal when the scan enable signal has a second logic level different from the first logic level, in embodiments.

At 608, the first clock signal is provided to the master latch of the flip-flop. The master latch is configured to receive a data signal and a scan input signal and to selectively provide one of the data signal or the scan input signal to the slave latch based on the scan enable signal. At 610, the second clock signal is provided to the slave latch of the flip-flop. The slave latch is configured to receive one of the data signal or the scan input signal from the master latch based on the scan enable signal.

Steps 606, 608, 610 are shown in the example of FIG. 2A, which shows the circuitry 250 generating the clkb_m and clkbb_m clock signals based on the scan enable signal and the input clock signal. The clkb_m and clkbb_m clock signals are first clock signals that are provided to the master latch 202, as illustrated in the figure. FIG. 2A also shows the circuitry 250 generating the clkb and clkbb clock signals based on the input clock signal. The clkb and clkbb clock signals are second clock signals provided to the slave latch 204, as shown in the figure. The relationship between the first and second clock signals varies based on a state of the scan enable signal, as described above with reference to FIGS. 2B-2D. The examples of FIGS. 3A, 4A, and 5A likewise depict circuits 350, 450, and 550, respectively, that generate first and second clock signals based on one or both of a received input clock signal and scan enable signal. The first and second clock signals are provided to the master and slave latches, respectively, as shown in these figures.

The present disclosure is directed to a skew-tolerant flip-flop. As described above, rather than utilize a single clocking methodology in both a functional mode (e.g., when a scan enable signal has a logic level low value) and a scan testing mode (e.g., when the scan enable signal has a logic level high value), the skew-tolerant flip-flop described herein utilizes different clocking methodologies depending on whether the mode of operation is the functional mode or the scan testing mode. In the functional mode, a clock signal to a master latch of the flip-flop is delayed relative to a clock signal to a slave latch of the flip-flop. The delaying of the clock signal to the master latch in the functional mode of operation improves the skew tolerance of the flip-flop. In the scan testing mode, the master and slave latches are driven by non-overlapping or substantially non-overlapping clock signals. The use of the overlapping or substantially non-overlapping clock signals in the scan testing mode decreases an area overhead and power consumption of the flip-flop as compared to conventional flip-flops that delay clocking to the master latch during all modes of operation.

The present disclosure is directed to a flip-flop. An embodiment of a flip-flop includes a master latch configured to receive a data signal and a scan input signal. A slave latch is coupled to the master latch, and the master latch selectively provides one of the data signal or the scan input signal to the slave latch based on a scan enable signal received by the master latch. The flip-flop includes circuitry configured to receive the scan enable signal and generate multiple clock signals based on one or both of an input clock signal and the scan enable signal. The clock signals include (i) a first clock signal that is provided to the master latch, and (ii) a second clock signal that is provided to the slave latch. The first clock signal does not include edge transitions that occur at same times as edge transitions of the second clock signal when the scan enable signal has a first logic level. The first clock signal includes edge transitions that occur at same times as edge transitions of the second clock signal when the scan enable signal has a second logic level different from the first logic level.

Another embodiment of a flip-flop includes a master latch configured to receive a data signal and a scan input signal. A slave latch is coupled to the master latch, and the master latch selectively provides one of the data signal or the scan input signal to the slave latch based on a scan enable signal received by the master latch. The flip-flop includes circuitry configured to generate multiple clock signals based on an input clock signal. The clock signals include a first clock signal that is provided to the master latch and a second clock signal that is provided to the slave latch. The circuitry includes a first logic gate configured to (i) receive the scan enable signal, and (ii) generate an output that varies based on a logic level of the scan enable signal. The circuitry also includes a second logic gate configured to generate the first or second clock signal based on the output of the first logic gate. Edge transitions of the first clock signal are delayed in time in comparison to edge transitions of the second clock signal when the scan enable signal has a first logic level. The first clock signal includes edge transitions that occur at same times as edge transitions of the second clock signal when the scan enable signal has a second logic level different from the first logic level.

In an embodiment of a method for providing clock signals to a flip-flop having a master latch and a slave latch, a scan enable signal and an input clock signal are received. First and second clock signals are generated based on one or both of the input clock signal and the scan enable signal. The first clock signal does not include edge transitions that occur at same times as edge transitions of the second clock signal when the scan enable signal has a first logic level. The first clock signal includes edge transitions that occur at same times as edge transitions of the second clock signal when the scan enable signal has a second logic level different from the first logic level. The first clock signal is provided to the master latch, and the second clock signal is provided to the slave latch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop comprising:
   a master latch configured to receive a data signal and a scan input signal;
   a slave latch coupled to the master latch, the master latch selectively providing one of the data signal or the scan input signal to the slave latch based on a scan enable signal received by the master latch; and
   circuitry configured to receive the scan enable signal and generate multiple clock signals based on one or both of an input clock signal and the scan enable signal, the clock signals including (i) a first clock signal that is provided to the master latch, and (ii) a second clock signal that is provided to the slave latch, wherein the first clock signal does not include edge transitions that occur at same times as edge transitions of the second clock signal when the scan enable signal has a first logic level, and wherein the first clock signal includes edge transitions that occur at same times as edge transitions of the second clock signal when the scan enable signal has a second logic level different from the first logic level.

2. The flip-flop of claim 1, wherein the circuitry comprises:
   a first logic gate configured to (i) receive the scan enable signal, and (ii) generate an output that varies based on a logic level of the scan enable signal; and
   a second logic gate configured to generate the first or second clock signal based on the output of the first logic gate.

3. The flip-flop of claim 2, wherein the first logic gate generates the output based on (i) a logical combination of the scan enable signal and the input clock signal, (ii) a logical combination of the scan enable signal and the first clock signal, (iii) a logical combination of an inverted version of the scan enable signal and the first clock signal, (iv) a logical combination of the scan enable signal and the second clock signal, or (v) a logical combination of the inverted version of the scan enable signal and the second clock signal.

4. The flip-flop of claim 2, wherein the second logic gate generates the first or second clock signal based on (i) a logical combination of the output and a delayed version of the input clock signal, or (ii) a logical combination of the output and an inverted version of the input clock signal.

5. The flip-flop of claim 1, wherein the circuitry comprises:
   a first logic gate configured to (i) receive the scan enable signal, and (ii) generate an output that varies based on a logic level of the scan enable signal; and
   a second logic gate configured to generate the first clock signal based on the output of the first logic gate, the first clock signal varying based on the logic level of the scan enable signal, wherein the second clock signal does not vary based on the logic level of the scan enable signal.

6. The flip-flop of claim 1, wherein the circuitry comprises:
   a first logic gate configured to (i) receive the scan enable signal, and (ii) generate an output that varies based on a logic level of the scan enable signal; and
   a second logic gate configured to generate the second clock signal based on the output of the first logic gate, the second clock signal varying based on the logic level of the scan enable signal, wherein the first clock signal does not vary based on the logic level of the scan enable signal.

7. The flip-flop of claim 1, wherein the circuitry comprises:
   a first logic gate configured to (i) receive the scan enable signal, and (ii) generate an output that varies based on a logic level of the scan enable signal; and
   a second logic gate configured to generate the first clock signal based on the output of the first logic gate, the first clock signal varying based on the logic level of the scan enable signal, wherein the first clock signal comprises an inverted version of the second clock signal when the scan enable signal has the second logic level, wherein the first clock signal includes edge transitions that are delayed in time in comparison to edge transitions of the second clock signal when the scan enable signal has the first logic level, and wherein the second clock signal does not vary based on the logic level of the scan enable signal.

8. The flip-flop of claim 1, wherein the first clock signal includes edge transitions that are delayed in time in comparison to edge transitions of the second clock signal when the scan enable signal has the first logic level, and wherein the first clock signal comprises an inverted version of the second clock signal when the scan enable signal has the second logic level, the inverted version of the second clock signal being generated by manipulating a scan control in the flip-flop.

9. The flip-flop of claim 1, wherein the first and second clock signals have non-overlapping or substantially non-overlapping clock phases when the scan enable signal has the second logic level.

10. The flip-flop of claim 1, wherein when the scan enable signal has the second logic level, (i) a positive edge transition of the first clock signal occurs at a same time as a negative edge transition of the second clock signal, and (ii) a negative edge transition of the first clock signal occurs at a same time as a positive edge transition of the second clock signal.

11. The flip-flop of claim 1, wherein when the scan enable signal has the first logic level, an edge transition of the first clock signal is delayed in time in comparison to an edge transition of the second clock signal.

12. The flip-flop of claim 11, wherein when the scan enable signal has the first logic level, (i) a positive edge transition of the first clock signal is delayed in time in comparison to a negative edge transition of the second clock signal, and (ii) a negative edge transition of the first clock signal is delayed in time in comparison to a positive edge transition of the second clock signal.

13. The flip-flop of claim 1, wherein the circuitry comprises:
   a delay circuit configured to generate a delayed version of the second clock signal, wherein when the scan enable signal has the first logic level, the first clock signal is based on the delayed version of the second clock signal, and the edge transitions of the first clock signal are delayed in time in comparison to the edge transitions of the second clock signal.

14. The flip-flop of claim 1, wherein the circuitry comprises:
   an AND logic gate configured to receive the input clock signal and the scan enable signal, the AND logic gate generating a first output based on a logical combination of the input clock signal and the scan enable signal;

clock delay buffers that comprise a plurality of serially-connected inverters, the clock delay buffers being configured to receive the second clock signal and to generate a second output that is a delayed version of the second clock signal; and a NOR logic gate configured to receive the first and second outputs, the NOR logic gate generating a third output based on a logical combination of the first and second outputs, wherein the first clock signal is based on the third output.

15. The flip-flop of claim 14, wherein the circuitry further comprises:

a first inverter that is configured to receive the input clock signal and to generate a fourth output that is an inverted version of the input clock signal; and a second inverter serially-coupled to the first inverter and configured to receive the fourth output and generate a fifth output that is an inverted version of the fourth output, wherein the fifth output is the second clock signal.

16. A flip-flop comprising:

a master latch configured to receive a data signal and a scan input signal;

a slave latch coupled to the master latch, the master latch selectively providing one of the data signal or the scan input signal to the slave latch based on a scan enable signal received by the master latch; and circuitry configured to generate multiple clock signals based on an input clock signal, the clock signals including (i) a first clock signal that is provided to the master latch, and (ii) a second clock signal that is provided to the slave latch, the circuitry including:

a first logic gate configured to (i) receive the scan enable signal, and (ii) generate an output that varies based on a logic level of the scan enable signal, and a second logic gate configured to generate the first or second clock signal based on the output of the first logic gate, wherein edge transitions of the first clock signal are delayed in time in comparison to edge transitions of the second clock signal when the scan enable signal has a first logic level, and wherein the first clock signal includes edge transitions that occur at same times as edge transitions of the second clock signal when the scan enable signal has a second logic level different from the first logic level.

17. The flip-flop of claim 16, wherein the first logic gate generates the output based on (i) a logical combination of the scan enable signal and the input clock signal, (ii) a logical combination of the scan enable signal and the first clock signal, (iii) a logical combination of an inverted version of the scan enable signal and the first clock signal, (iv) a logical combination of the scan enable signal and the second clock signal, or (v) a logical combination of the inverted version of the scan enable signal and the second clock signal.

18. The flip-flop of claim 16, wherein the second logic gate generates the first or second clock signal based on (i) a logical combination of the output and a delayed version of the input clock signal, or (ii) a logical combination of the output and an inverted version of the input clock signal.

19. The flip-flop of claim 16, wherein the first and second clock signals have non-overlapping or substantially non-overlapping clock phases when the scan enable signal has the second logic level.

20. A method for providing clock signals to a flip-flop having a master latch and a slave latch, the method comprising:

receiving a scan enable signal;

receiving an input clock signal;

generating first and second clock signals based on one or both of the input clock signal and the scan enable signal, the generating of the first and second clock signals including (i) providing the scan enable signal to a first logic gate, the first logic gate generating an output that varies based on a logic level of the scan enable signal, and (ii) using a second logic gate to generate the first or second clock signal based on the output of the first logic gate, the first clock signal not including edge transitions that occur at same times as edge transitions of the second clock signal when the scan enable signal has a first logic level, and the first clock signal including edge transitions that occur at same times as edge transitions of the second clock signal when the scan enable signal has a second logic level different from the first logic level;

providing the first clock signal to the master latch; and providing the second clock signal to the slave latch.

* * * * *